(12) United States Patent
Augustine et al.

(10) Patent No.: US 10,423,203 B2
(45) Date of Patent: Sep. 24, 2019

(54) FLIP-FLOP CIRCUIT WITH LOW-LEAKAGE TRANSISTORS

(71) Applicant: Intel Corporation, Santa Clara, CA (US)

(72) Inventors: Charles Augustine, Portland, OR (US); Rafael Rios, Austin, TX (US); Somnath Paul, Hillsboro, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 329 days.

(21) Appl. No.: 15/392,559

(22) Filed: Dec. 28, 2016

(65) Prior Publication Data

US 2018/0181175 A1 Jun. 28, 2018

(51) Int. Cl.
*G06F 1/26* (2006.01)
*H03K 3/012* (2006.01)
*G06F 1/3293* (2019.01)
*H03K 3/356* (2006.01)

(52) U.S. Cl.
CPC ............ *G06F 1/263* (2013.01); *G06F 1/3293* (2013.01); *H03K 3/012* (2013.01); *H03K 3/356008* (2013.01); *H03K 3/356156* (2013.01)

(58) Field of Classification Search
CPC . G06F 1/263; G06F 1/3293; H03K 3/356156; H03K 3/356008; H03K 3/012
See application file for complete search history.

(56) References Cited

U.S. PATENT DOCUMENTS

| 2010/0156458 | A1 | 6/2010 | Speers |
| 2011/0148496 | A1 | 6/2011 | Sriadibhatla |
| 2012/0062308 | A1 | 3/2012 | Chakrabarty et al. |
| 2013/0083588 | A1* | 4/2013 | Takemura ........... G11C 11/4125 365/149 |
| 2013/0222033 | A1* | 8/2013 | Kato ........................ G11C 7/04 327/214 |
| 2014/0232430 | A1 | 8/2014 | Cowley et al. |
| 2016/0276370 | A1* | 9/2016 | Miyairi ............... H01L 21/8258 |

OTHER PUBLICATIONS

International Search Report and Written Opinion dated Mar. 9, 2018 for International Application No. PCT/US2017/063448, 17 pages.
Sjokvist et al., "Zero Area Overhead State Retention Flip Flop Utilizing Crystalline In—Ga—Zn Oxide Technology", Autumn Meeting of the Japanese Society of Applied Physics, (2013), 1 page.

* cited by examiner

*Primary Examiner* — Seokjin Kim
(74) *Attorney, Agent, or Firm* — Schwabe, Williamson & Wyatt, P.C.

(57) ABSTRACT

Embodiments include apparatuses, methods, and systems for a flip-flop circuit with low-leakage transistors. The flip-flop circuit may be coupled to a logic circuit of an integrated circuit to store data for the logic circuit when the logic circuit is in a sleep state. The flip-flop circuit may pass a data signal for the logic circuit along a signal path. A capacitor may be coupled between the signal path and ground to store a value of the data signal when the logic circuit is in the sleep state. A low-leakage transistor, such as an IGZO transistor, may be coupled between the capacitor and the signal path and may selectively turn on when the logic circuit transitions from the active state to the sleep state to store the value of the data signal in the capacitor. Other embodiments may be described and claimed.

10 Claims, 7 Drawing Sheets

FLIP-FLOP CIRCUIT WITH LOW-LEAKAGE TRANSISTORS

FIELD

Embodiments of the present invention relate generally to the technical field of electronic circuits, and more particularly to flip-flop circuits with low-leakage transistors.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Many electronic circuits, such as processors, use power gating to turn off circuit blocks that are not in use, thereby saving power. Typically, some data must be retained in order to turn a circuit block off. That data may be stored in memory arrays, flip-flops, and/or latches. The circuit elements used to store the data must be connected to an always-on power supply that is not power gated when other circuit blocks are power gated.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
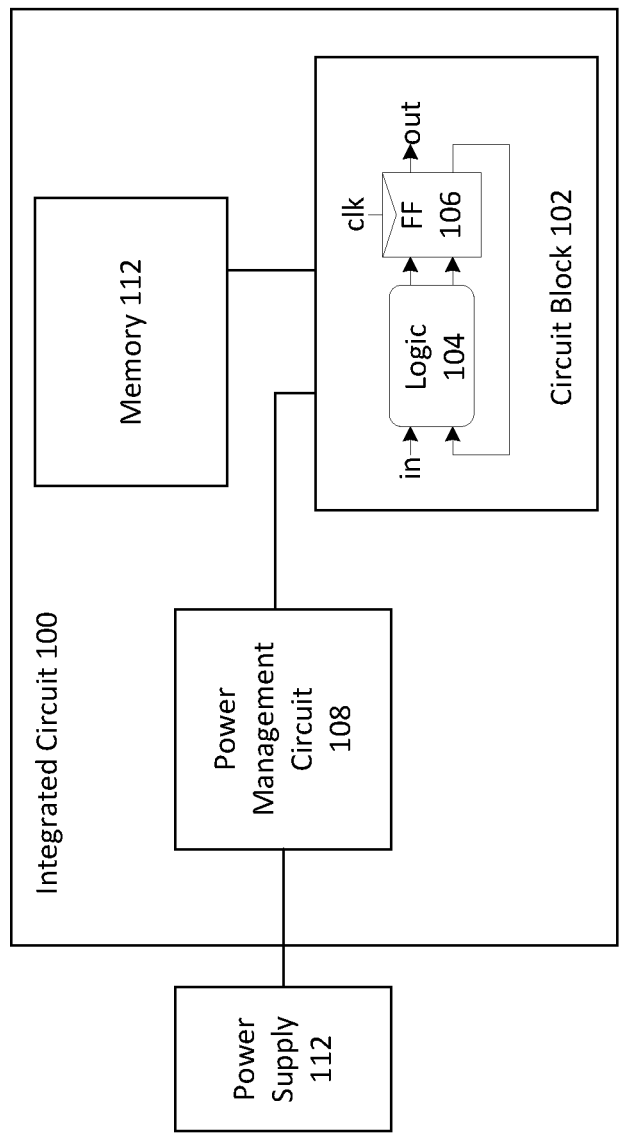
FIG. 1A illustrates an integrated circuit coupled to a power source, the integrated circuit including a circuit block having a logic and a flip-flop, in accordance with various embodiments.

Embodiments include apparatuses, methods, and systems for a flip-flop circuit with low-leakage transistors. The flip-flop circuit may be coupled to a circuit block of an integrated circuit to store data for the circuit block when the circuit block is in a sleep state. The flip-flop circuit may pass a data signal for the circuit block along a signal path (e.g., responsive to a clock signal). A capacitor may be coupled between the signal path and ground to store a value of the data signal when the circuit block is in the sleep state. A low-leakage transistor, such as a thin-film transistor (TFT, e.g., an indium-gallium zinc oxide (IGZO) transistor), may be coupled between the capacitor and the signal path (e.g., at a slave stage of the flip-flop). The low-leakage transistor may selectively turn on when the circuit block transitions from the active state to the sleep state to conductively couple the capacitor to the signal path and thereby store the value of the data signal in the capacitor. When the circuit block transitions from the sleep state back to the active state, the flip-flop circuit may restore the value of the data signal back to the signal path. The value of the data signal may also be referred to as a flip-flop slave stage value.

In various embodiments, the flip-flop circuit may include a pair of cross-coupled inverters coupled on the signal path between a first node and a second node. The first node and second node may be included in the slave stage of the flip-flop circuit. In some embodiments, the flip-flop circuit may include two capacitors. A first capacitor may store a value of the data signal when the circuit block is in the sleep state, and a second capacitor may store an inverted value of the data signal when the circuit block is in the sleep state. A first IGZO transistor may be coupled between the first capacitor and the first node, the first IGZO transistor to turn on responsive to a retain signal when the circuit block transitions from the active state to the sleep state. The flip-flop circuit may further include a first transistor having a gate terminal coupled to a node between the IGZO transistor and the capacitor, and a second transistor coupled between the first transistor and the second node, the second transistor to turn on responsive to a restore signal when the circuit block transitions from the sleep state to the active state.

The flip-flop circuit may further include a second IGZO transistor coupled between the second capacitor and the second node, the second IGZO transistor to turn on responsive to the retain signal. Additionally, the flip-flop circuit may include a third transistor having a gate terminal coupled to a node between the second IGZO transistor and the second capacitor, and a fourth transistor coupled between the third transistor and the first node, the fourth transistor to turn on responsive to the restore signal when the circuit block transitions from the sleep state to the active state. In some embodiments, the first, second, third, and fourth transistors may be complementary metal-oxide-semiconductor (CMOS) (e.g., NMOS) transistors.

Alternatively, the flip-flop circuit may include a single capacitor to store a value of the data signal when the circuit block is in the sleep state. For example, the capacitor may be coupled between the first node and the second node to store a voltage that corresponds to a voltage difference between the first node and the second node. The flip-flop circuit may include a first transistor coupled between a first terminal of the capacitor and the first node, and a second transistor coupled between a second terminal of the capacitor and the second node. The first and second transistors may be responsive to a retain signal (e.g., may receive the retain signal at their gate terminals) to turn on when the circuit block transitions from the active state to the sleep state to charge the capacitor and to turn on again when the circuit block transitions from the sleep state to the active state to restore the voltage difference between the first node and the second node (and thereby restore the state of the data signal).

In some embodiments, the flip-flop circuit may further include a third transistor coupled between the first terminal of the capacitor and a ground potential and having a gate terminal coupled to the second terminal of the capacitor, and a fourth transistor coupled between the second terminal of the capacitor and the ground potential and having a gate terminal coupled to the first terminal of the capacitor. In some embodiments, the first, second, third, and/or fourth transistors may be TFTs, such as IGZO transistors.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1A illustrates an integrated circuit 100 in accordance with various embodiments. The integrated circuit 100 may include a circuit block 102 that includes a logic 104 and a flip-flop circuit 106 coupled to one another. The logic 104 may be any suitable logic, such as combinational logic and/or sequential logic. The integrated circuit 100 may further include a power management circuit 108 and/or a memory 110 coupled to the circuit block 102 and/or the flip-flop array 104. In various embodiments, the components of the integrated circuit 100 (e.g., the circuit block 102, the power management circuit 108, and/or the memory 110) may be disposed on a same die. The power management circuit 108 may further be coupled to a power supply 112. In some embodiments, the power supply 112 may be external to the integrated circuit 112. For example, the power supply 112 may be a battery or a hardwired power connection (e.g., wall socket) in some embodiments.

Figure 1B:
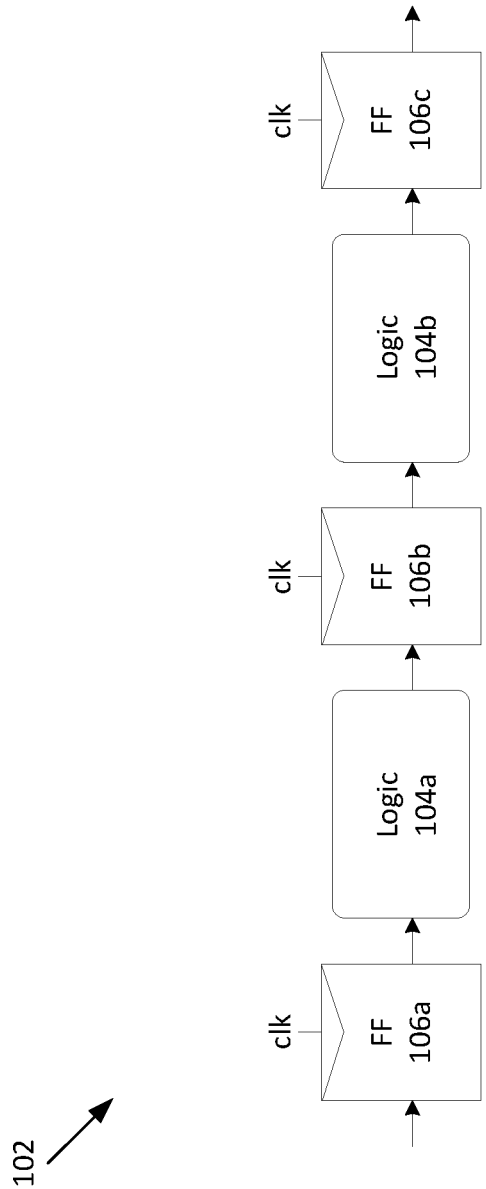
FIG. 1B illustrates an alternative arrangement of the circuit block of FIG. 1A, in accordance with various embodiments.

In some embodiments, the integrated circuit 100 may include a plurality of circuit blocks 102. The circuit blocks 102 may have different functions and/or be disposed in different regions of the integrated circuit 100. Additionally, or alternatively, the circuit block 102 may include a plurality of logic 104 and/or flip-flop circuits 106. For example, FIG. 1B illustrates an embodiment of the circuit block 102 that includes flip-flop circuits 106a-c alternating with different blocks of logic 104a-b in a pipeline configuration to pass the data signal between the blocks of logic 104a-b and/or to hold the state of the data signal when the circuit block 102 is in the sleep state.

In various embodiments, the power management circuit 108 may selectively power gate the circuit block 102 (e.g., instruct the circuit block 102 to enter a sleep state). A power supply provided to the circuit block 102 (e.g., logic 104 and flip-flop circuit 106) may be reduced and/or turned off while the circuit block 102 is power gated. In some embodiments, the power supply may be provided to the circuit block 102 by the power management circuit 108.

In various embodiments, the flip-flop circuit 106 may store/retain data (e.g., state information) for the circuit block 102 (e.g., the logic 104) while the circuit block 102 and/or logic 104 is power gated. The flip-flop circuits 106 may also receive a power supply that is reduced or turned off while the logic 104 is power gated. For example, in some embodiments, the flip-flop circuits 106 may receive a same power supply as the logic 104.

In various embodiments, the flip-flop circuits 106 may include one or more low-leakage transistors, such as IGZO transistors or another type of TFTs. In some embodiments, the TFTs may include a thin film of an active semiconductor layer (e.g., IGZO for an IGZO transistor) on a supporting substrate. The supporting substrate may be non-conductive (e.g., glass) or semiconductive (e.g., silicon) in some embodiments. The TFTs may further include one or more dielectric layers, conductive (e.g., metal) source, drain, and gate contacts, and/or one or more other layers on, under, or in the active semiconductor layer.

In various embodiments, the low-leakage transistors may enable the flip-flop circuits 106 to retain the data for the circuit block 102 for a longer period of time without receiving power than prior flip-flop circuits. Accordingly, the flip-flop circuit 106 may not require an always-on power supply that stays powered on at the same voltage level even when the logic 104 is power gated.

Figure 2:
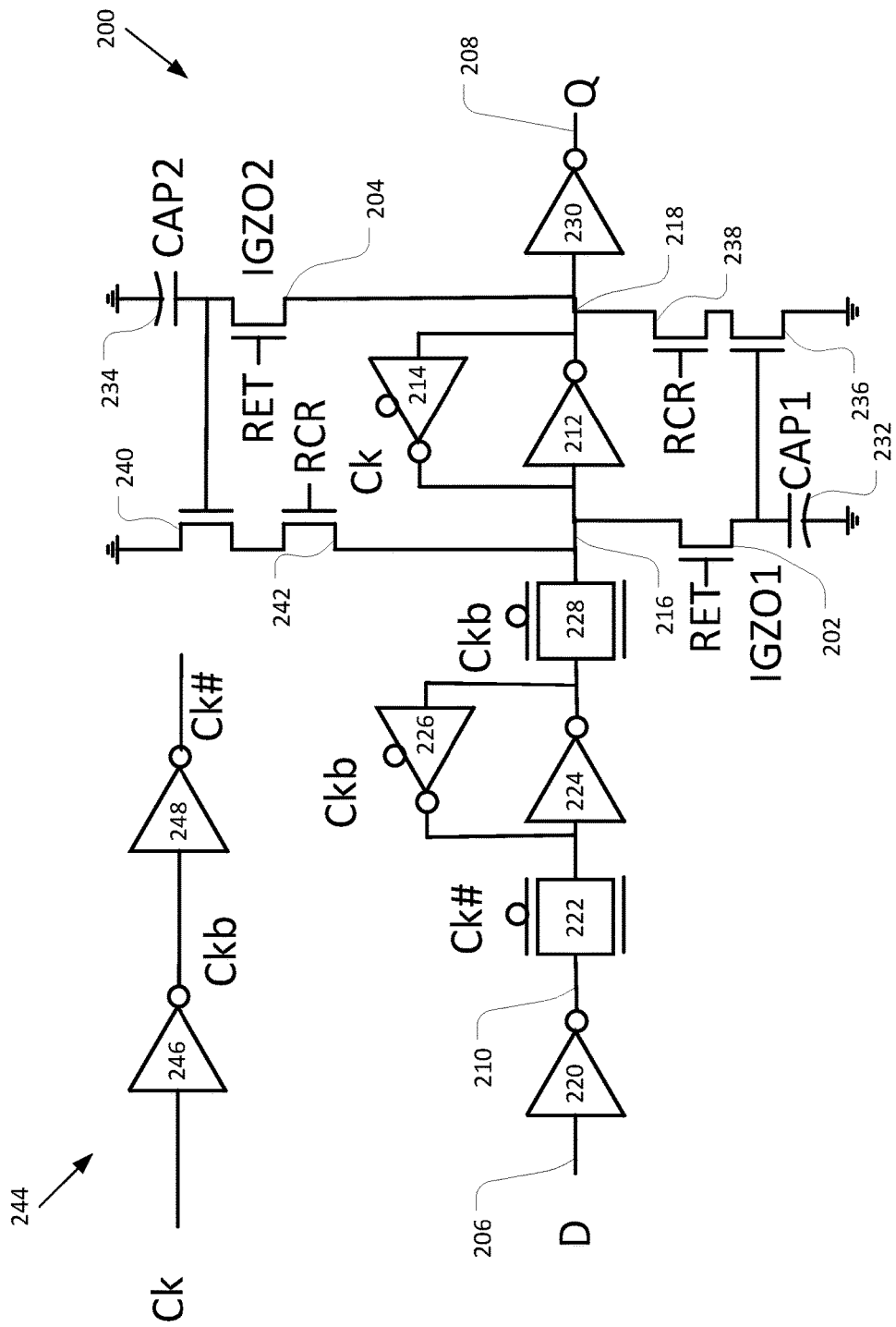
FIG. 2 illustrates a flip-flop circuit that may be included in the flip-flop array of FIG. 1, in accordance with various embodiments.

FIG. 2 illustrates a flip-flop circuit 200 in accordance with various embodiments. The flip-flop circuit 200 may correspond to the flip-flop circuits 106 of integrated circuit 100 in some embodiments. Flip-flop circuit 200 may be used to store/retain data for a circuit block (e.g., circuit block 102 of integrated circuit 100, such as logic 104 of circuit block 102) while the circuit block is power gated (e.g., in a sleep state). The flip-flop circuit 200 may include IGZO transistors 202 (IGZO1) and 204 (IGZO2) in accordance with various embodiments. As discussed further herein, the IGZO transistors 202 and 204 may have lower leakage than other transistors (e.g., CMOS transistors). Accordingly, the power supply that is coupled to the flip-flop circuit 200 may also be turned off or reduced while the circuit block is power gated. For example, the same power supply may provide power for the flip-flop circuit 200 and the associated circuit block. Although the transistors 202 and 204 are described as being IGZO transistors, in some embodiments, other low-leakage transistors may be used for the transistors 202 and 204, for example another type of TFT or a tunneling FET (TFET).

In various embodiments, the flip-flop circuit 200 may receive an input data signal (D) at an input terminal 206 and pass the data signal to an output terminal 208 (e.g., as an output data signal Q) along a signal path 210. The flip-flop circuit 200 may further include a pair of cross-coupled inverters 212 and 214 coupled between a first node 216 and a second node 218. The first node 216 and second node 218 may be coupled on the signal path 210. The first node, 216, second node 218, and cross-coupled inverters 212 and 214 may be included in a slave stage of the flip-flop circuit 200.

In some embodiments, the flip-flop circuit 200 may further include an inverter 220, a transmission gate 222, cross-coupled inverters 224 and 226, and/or transmission gate 228 coupled on the signal path 210 as shown. The flip-flop circuit 200 may further include an inverter 230 coupled between the second node 218 and the output terminal 208. In some embodiments, the inverter 212, inverter 214, inverter 220, transmission gate 222, inverter 224, inverter 226, transmission gate 228, and/or inverter 230 may include CMOS transistors.

In various embodiments, the flip-flop circuit 200 may further include a first capacitor 232 (CAP1) and a second capacitor 234 (CAP2). The IGZO transistor 202 may be coupled between the first capacitor 232 and the first node 216, and the IGZO transistor 204 may be coupled between the second capacitor 234 and the second node 218. The first capacitor 232 and second capacitor 234 may be further coupled to ground (e.g., between ground and the respective IGZO transistor 202 or 204).

The flip-flop circuit 200 may further include transistors 236 and 238 coupled between the second node 218 and ground, and transistors 240 and 242 coupled between the first node 216 and ground. In some embodiments, the transistors 236, 238, 240, and/or 242 may be CMOS transistors, such as NMOS transistors. A gate terminal of the transistor 236 may be coupled to a node between the IGZO transistor 202 and the first capacitor 232 (e.g., to the drain terminal of the IGZO transistor 202). The transistor 238 may be coupled between the transistor 236 and the second node 218 and may receive a restore signal (RCR) at a gate terminal of the transistor 238. A gate terminal of the transistor 240 may be coupled to a node between the IGZO transistor 204 and the second capacitor 234 (e.g., to the drain terminal of the IGZO transistor 204). The transistor 242 may be coupled between the transistor 240 and the first node 216 and may receive the restore signal RCR at a gate terminal of the transistor 242.

In various embodiments, a clock circuit 244 may be coupled to the flip-flop circuit 200 to provide clock signals to components of the flip-flop circuit 200. The clock circuit 244 may include, for example, inverters 246 and 248 coupled in series. The inverter 246 may receive a clock signal Ck at an input of the inverter 246 and may pass a clock bar signal Ckb to an output of the inverter 246. The clock bar signal Ckb may be an inverse of the clock signal Ck. The inverter 248 may receive the clock bar signal Ckb at its input and may pass a delayed clock signal Ck# at an output of the inverter 248. The delayed clock signal Ck# may be a delayed version of the clock signal Ck (e.g., delayed by one clock cycle). The clock signal Ck, the clock bar signal Ckb, and the delayed clock signal Ck# may be provided to various components of the flip-flop circuit 200 as shown. For example, the PMOS transistor of the transmission gate 222 may receive the delayed clock signal Ck# at its gate terminal and the NMOS transistor of the transmission gate 222 may receive the clock bar signal Ckb at its gate terminal to control selective transmission of the transmission gate 222 on the signal path 210. The PMOS transistor of the transmission gate 228 may receive the clock bar signal Ckb at its gate terminal and the NMOS transistor may receive the clock signal Ck to control selective transmission of the transmission gate 228 on the signal path 210. The cross-coupled inverter 226 and 214 may be clocked inverters. For example, the inverter 226 may pass an inverted value of the input signal when the clock bar signal Ckb is logic 0 and may hold the output value when the clock bar signal Ckb is logic 1. Inverter 214 may pass an inverted value of its input signal when the clock signal Ck is logic 0 and may hold the output value when the clock signal Ck is logic 1. The inverters 220, 224, 212, and/or 230 may be unclocked inverters.

In various embodiments, the transmission gates 222 and 228 may be transparent (e.g., may pass the data signal from the input to the output) when the received clock signal is logic low (e.g., logic 0) and may hold the output (e.g., prevent the data signal from passing from the input to the output and maintain the current value of the signal at the output) when the received clock signal is logic high (e.g., logic 1). Accordingly, when the clock signal Ck is logic low, the input data signal D may be passed from the input terminal 206 through the inverter 220 (where it is inverted) and the transmission gate 222, and it may be held at the output of the transmission gate 222 (e.g., the input of the inverter 224).

When the clock signal Ck switches from logic low to logic high, the inverters 224 and 226 may pass the data signal from the input of the inverter 224 to the output of the inverter 224 (and invert it again), and the transmission gate 228 may be transparent to pass the signal to the output of the transmission gate 228 (e.g., the first node 216). When the clock signal Ck switches back from logic high to logic low, the inverters 212 and 214 may pass the data signal from the first node 216 to the second node 218 (and invert it). The inverter 230 may pass the data signal from the second node 218 to the output terminal 208 (and invert it again). Accordingly, the input data signal D may be sampled through the flip-flop circuit 200 on the signal path 210 and output as the output data signal Q.

Figure 3:
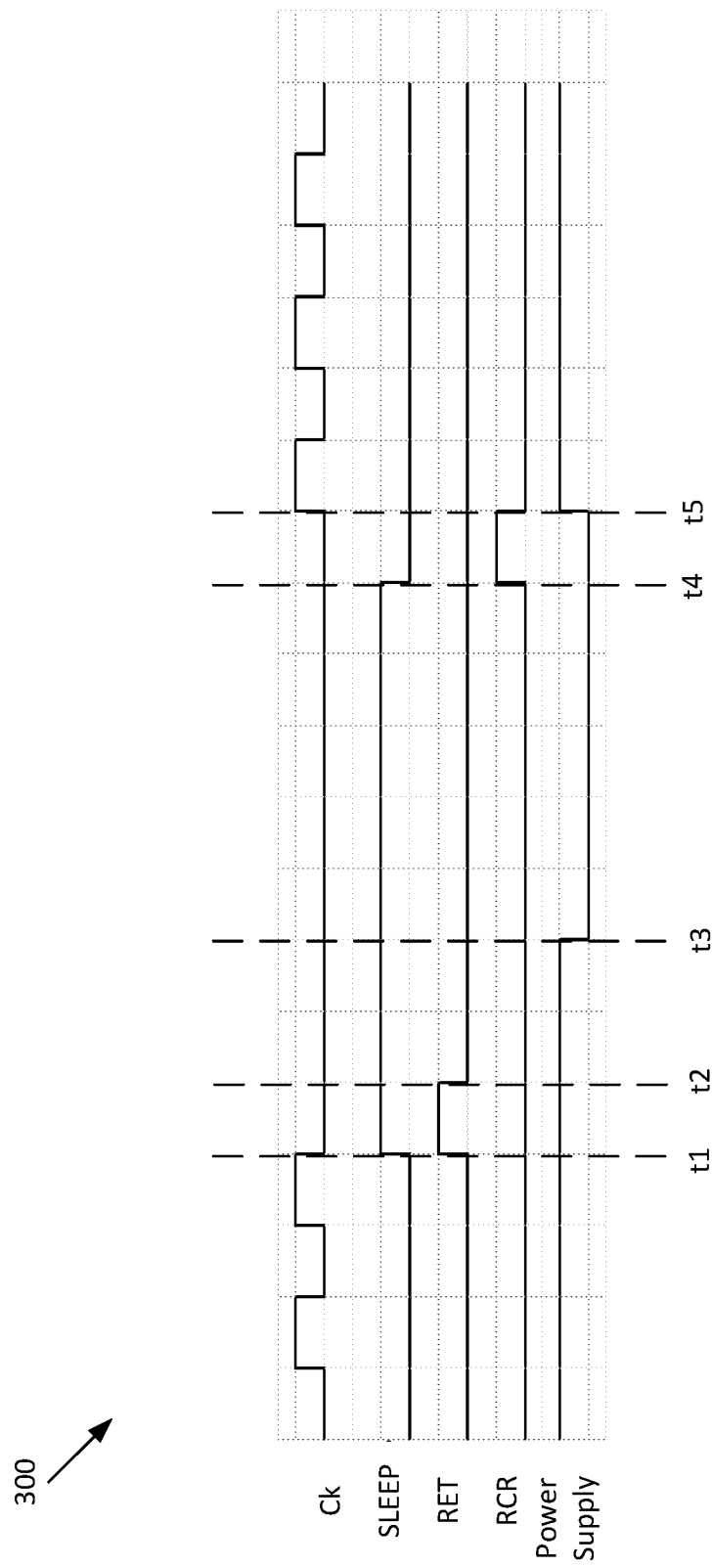
FIG. 3 illustrates voltage-time plots of signals that may be provided to the flip-flop circuit of FIG. 2 and/or the circuit block of FIG. 1, in accordance with various embodiments.

FIG. 3 illustrates signals 300 that may be received by the flip-flop circuit 200 and/or the circuit block 106 in accordance with various embodiments. For example, signals 300 may include the clock signal Ck, a sleep signal, the retain signal RET, the restore signal RCR, and a power supply signal. In various embodiments, one or more of the signals 300 may be provided to the flip-flop circuit 200 and/or the circuit block 102 by the power management circuit 108.

As discussed earlier, the circuit block 102 and/or flip-flop circuit 200 may be switchable between an active state and a sleep state. During the active state, the sleep signal may be logic low (e.g., logic 0), and the power signal may be on (e.g., at a voltage Vcc). Additionally, the clock signal Ck may be active (e.g., may alternate between logic low and logic high (e.g., logic 1)). The IGZO transistors 202 and 204 may be off and may not be coupled on the signal path 210. Accordingly, the flip-flop circuit 200 may not be subject to performance degradation that may otherwise occur with IGZO transistors coupled on the signal path.

In various embodiments, when the circuit block and/or flip-flop circuit 200 switches from the active state to the sleep state (e.g., at time t1 shown in FIG. 3), the sleep signal may transition to logic high. In some embodiments, the sleep signal may be provided to the circuit block that is to enter the sleep state to inform the circuit block that the sleep state has been initiated. Additionally, in some embodiments, the clock signal Ck may be deactivated (e.g., may remain at one logic level, such as logic low) when the sleep state is initiated. Furthermore, the retain signal RET may be activated. For example, the retain signal RET may have a pulse of logic high from time t1 to a time t2. In some embodiments, the retain signal RET may be logic high for one clock cycle. In other embodiments, the retain signal RET may be logic high for longer than one clock cycle. In some embodiments, the power management circuit may generate the sleep signal and pass the sleep signal to the circuit block. The circuit block may generate the retain signal RET that is passed to the flip-flop circuit.

When the retain signal RET is logic high the IGZO transistors 202 and 204 may turn on. Accordingly, the IGZO transistor 202 may conductively couple the first capacitor 232 to the first node 216, thereby charging the first capacitor 232 to a first voltage level corresponding to the voltage level of the first node 216. For example, if the first node 216 has a voltage level of logic high (e.g., Vcc), then the first capacitor 232 will store a voltage level of logic high (e.g., Vcc). If, on the other hand, the first node 216 has a voltage level of logic low (e.g., ground), then the first capacitor 232 will not store any voltage. In a similar manner, the IGZO transistor 204 may conductively couple the second capacitor 234 to the second node 218, thereby charging the second capacitor 234 to a second voltage level corresponding to the voltage level of the second node 218. The second voltage level stored by the second capacitor 234 may be a logical inverse of the first voltage level stored by the first capacitor 232 (e.g., because of the cross-coupled inverters 212 and 214). Accordingly, the voltages stored by the capacitors 232 and 234 may correspond to a state of the data signal on the signal path 210 at the time t1 when the sleep state is initiated.

In various embodiments, the voltage level of the power supply signal may be reduced at a time t3 that is after the time t1. In some embodiments, the time t3 may be after the time t2. For example, the time t3 may be 3 clock cycles after the time t1 and/or 2 clock cycle after the time t2. In other embodiments, there may be different time intervals between the times t1, t2, and/or t3. The power supply may be reduced to a voltage level that is less than Vcc. For example, in some embodiments, the power supply may be turned off (e.g., reduced to ground (0 Volts)).

In various embodiments, the restore signal RCR may be logic low while sleep is initiated. Accordingly, the transistors 238 and 242 may be off In various embodiments, at time t4, the sleep signal may transition back to logic low to transition the circuit block and/or flip-flop circuit 200 back to the active state. The restore signal RCR may have a pulse of logic high starting at time t4. The pulse of the restore signal RCR may turn on the transistors 238 and 242. The retain signal RET may remain at logic low, so that the IGZO transistors 202 and 204 may be off.

The capacitor 232 or 234 that stores the logic high voltage level may cause the respective transistor 236 or 240 to which it is coupled to turn on. The other transistor 236 or 240 (e.g., the transistor 236 or 240 that is coupled to the capacitor 232 or 234 that stores the logic low voltage level) may be off. For example, if the first capacitor 232 stores the logic high voltage level and the second capacitor 234 stores the logic low voltage level, then the transistor 236 may be on and the transistor 240 may be off. Since the transistor 238 may also be on responsive to the restore signal RCR, the second node 218 may be pulled to ground (logic low). The inverters 212 and 214 may force the first node 216 to logic high. Accordingly, the state of the data signal on the first node 216 and second node 218 may be restored.

In various embodiments, the power supply may be increased back to Vcc at a time t5. In some embodiments, time t5 may be after time t4 (e.g., by one half of a clock cycle). The clock signal Ck may be activated at time t4.

In various embodiments, the IGZO transistors 202 and 204 may have relatively low leakage (e.g., significantly lower leakage than CMOS transistors). Accordingly, the capacitors 232 and 234 may store the state of the data signal for a significantly longer period of time without an applied power supply than would be possible if the transistors 202 and 204 were CMOS transistors. Additionally, the IGZO transistors 202 and 204 are not coupled on the signal path 210, so the performance of the flip-flop circuit 200 during the active state may not be degraded.

The length of time that the flip-flop circuit 200 may store the state of the data signal (e.g., the retention time) may depend on the capacitance value of the capacitors 232 and 234 and the voltage level (e.g., Vcc) of the power supply. The retention time may generally be higher for higher capacitance values and higher Vcc voltage level. The charging time required to charge the capacitors 232 and 234 may also increase with increased capacitance values.

Figure 4:
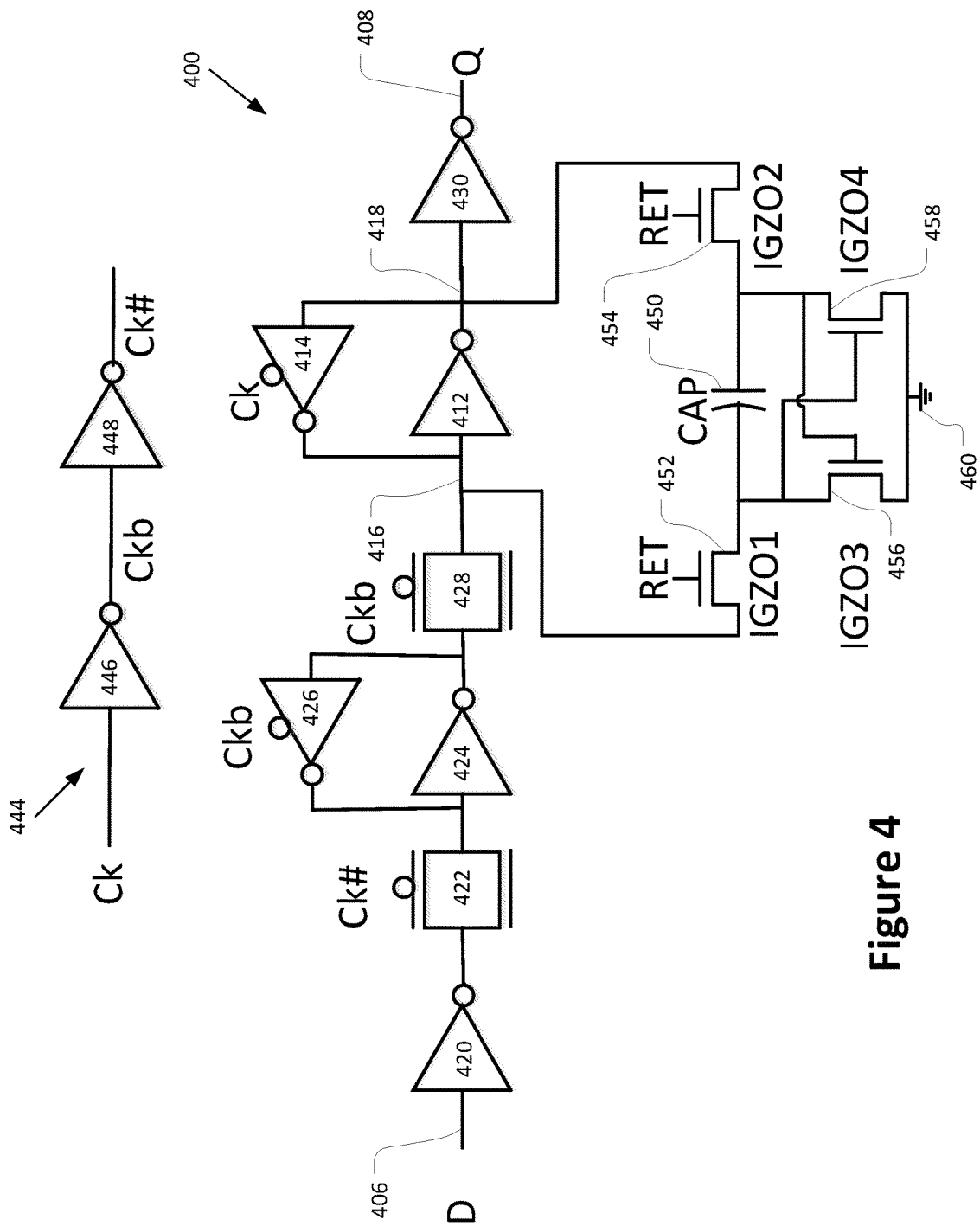
FIG. 4 illustrates another flip-flop circuit that may be included in the flip-flop array of FIG. 1, in accordance with various embodiments.
Figure 5:
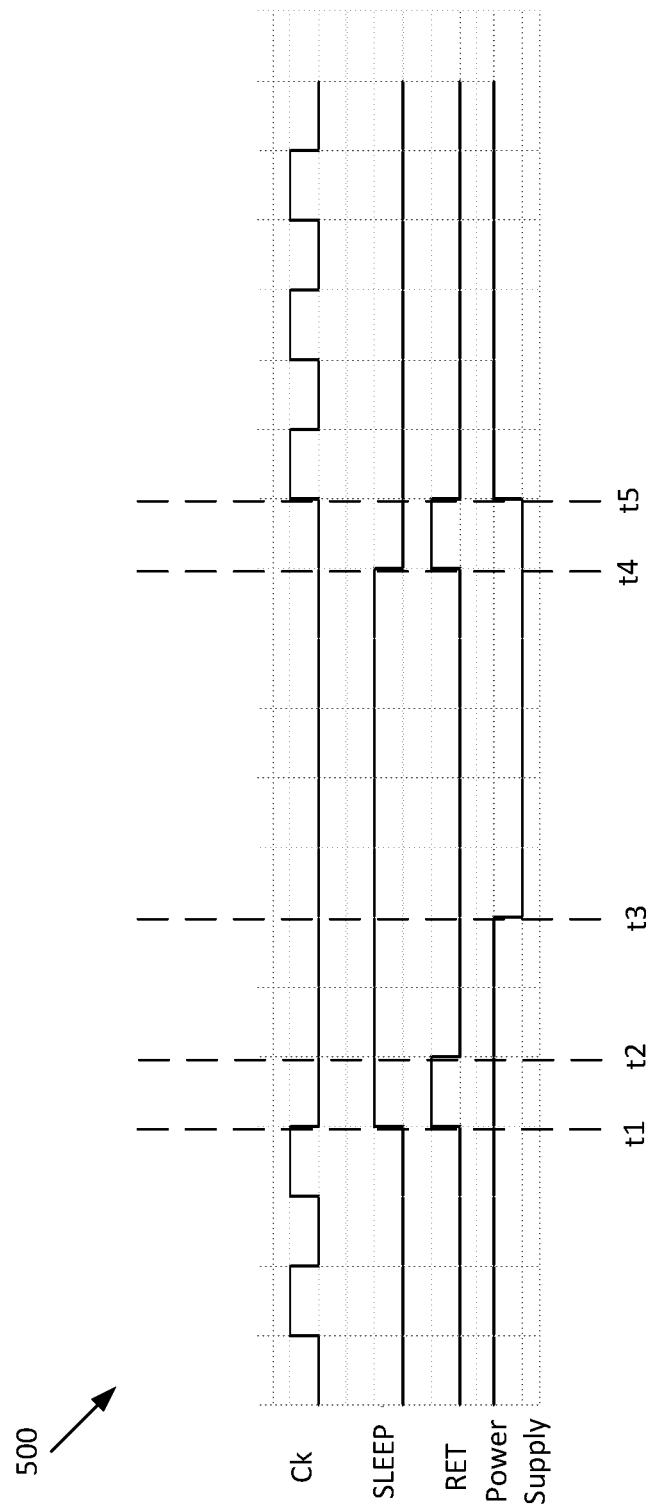
FIG. 5 illustrates voltage-time plots of signals that may be provided to the flip-flop circuit of FIG. 4 and/or the circuit block of FIG. 1, in accordance with various embodiments.

FIG. 4 illustrates another flip-flop circuit 400, in accordance with various embodiments. The flip-flop circuit 400 may correspond to the flip-flop circuits 106 of integrated circuit 100 in some embodiments. Flip-flop circuit 400 may be used to store/retain data for a circuit block (e.g., circuit block 102 of integrated circuit 100) while the circuit block is power gated (e.g., in a sleep state). FIG. 5 illustrates signals 500 that may be provided to various components of the flip-flop circuit 400 and/or the circuit block, in accordance with various embodiments. For example, the signals 500 may include a clock signal Ck, a sleep signal, a retain signal RET, and a power supply Vcc.

In various embodiments, the flip-flop circuit 400 may include an inverter 420, a transmission gate 422, cross-coupled inverters 424 and 426, transmission gate 428, cross-coupled inverters 412 and 414, and inverter 430 coupled on a signal path 410 between an input terminal 406 and an output terminal 408, which may be similar to corresponding components of the flip-flop circuit 200 described above. A clock circuit 444 may be coupled to the flip-flop circuit 400 to provide clock signals (e.g., clock signal Ck, clock bar signal Ckb, and delayed clock signal Ck#) to components of the flip-flop circuit 400. The clock circuit 444 may be similar to the clock circuit 242 shown in FIG. 2. For example, the clock circuit 444 may include inverters 446 and 448.

In various embodiments. the flip-flop circuit 400 may include a capacitor 450 and IGZO transistors 452, 454, 456, and 458. The IGZO transistor 452 may be coupled between a first terminal of the capacitor 450 and the first node 416, and the IGZO transistor 454 may be coupled between a second terminal of the capacitor 450 and the second node 418. The IGZO transistor 456 may have a source terminal coupled to the first terminal of the capacitor 450, a drain terminal coupled to ground 460, and a gate terminal coupled to the second terminal of the capacitor 450. The transistor 458 may have a source terminal coupled to the second terminal of the capacitor 450, a drain terminal coupled to ground 460, and a gate terminal coupled to the first terminal of the capacitor 450.

In various embodiments, the gate terminals of the IGZO transistors 452 and 454 may receive a retain signal RET. As shown in FIG. 5, the retain signal may have a logic high pulse starting at time t1 when the sleep state is initiated, and again at time t4 when the circuit block is transitioned from the sleep state back to the active state. The retain signal may be logic low between time t2 (the end of the pulse to initiate the sleep state) and time t4 (the start of the pulse to initiate the active state). The IGZO transistors 452 and 454 may turn on responsive to the pulses in the retain signal RET. When the sleep state is initiated at time t1, the IGZO transistors 452 and 454 may turn on, thereby conductively coupling the capacitor 450 between the first node 416 and the second node 418. Accordingly, the capacitor may store a voltage that corresponds to the voltage difference between the first node 416 and the second node 418. At time t4, when the circuit block is transitioned from the sleep state back to the active state, the IGZO transistors 452 and 454 may turn on again responsive to the second pulse in the retain signal RET. Accordingly, the charged capacitor 450 may be conductively coupled between the first node 416 and the second node 418, and the capacitor 450 may restore the voltage difference between the first node 416 and the second node 418.

The IGZO transistors 456 and 458 may assist in restoring the voltage difference between the first node 416 and the second node 418 (and thereby restoring the value of the data signal). For example, if, at the time the flip-flop circuit 400 enters the sleep state, the first node 416 is a logic 1 and the second node 418 is a logic 0, then the capacitor 450 will store a corresponding voltage difference. Since the gate terminals of the IGZO transistors 456 and 458 are coupled to the second terminal and first terminal, respectively, of the capacitor 450, the voltage stored by the capacitor 450 may cause the IGZO transistor 458 to be on and the IGZO transistor 456 to be off. Accordingly, when the IGZO transistor 454 turns on to transition the flip-flop circuit 400 back to the active state, the IGZO transistor 458 may pull the second node 418 to ground to assist in restoring the voltage difference between the first node 416 and the second node 418.

Conversely, if, at the time the flip-flop circuit 400 enters the sleep state, the first node 416 is logic 0 and the second node 418 is logic 1, then the voltage stored by the capacitor 450 may cause the IGZO transistor 456 to be on and the IGZO transistor 458 to be off. Accordingly, when the IGZO transistor 452 turns on to transition the flip-flop circuit 400 back to the active state, the IGZO transistor 456 may pull the first node 416 to ground to assist in restoring the voltage difference between the first node 416 and the second node 418.

As shown in FIGS. 2 and 4, the flip-flop circuit 400 of FIG. 4 may use one capacitor and four IGZO transistors to retain and restore the data, while the flip-flop circuit 200 of FIG. 2 may use two capacitors and six transistors (2 of which may be IGZO transistors and 4 of which may be CMOS transistors) to retain and restore the data. Accordingly, the flip-flop circuit 400 of FIG. 4 may use less circuit area than the flip-flop circuit 200 of FIG. 2. Additionally, the flip-flop circuit 400 may require one control signal (e.g., the retain signal RET), while the flip-flop circuit 200 may require two control signals (e.g., the retain signal RET and the restore signal RCR).

Figure 6:
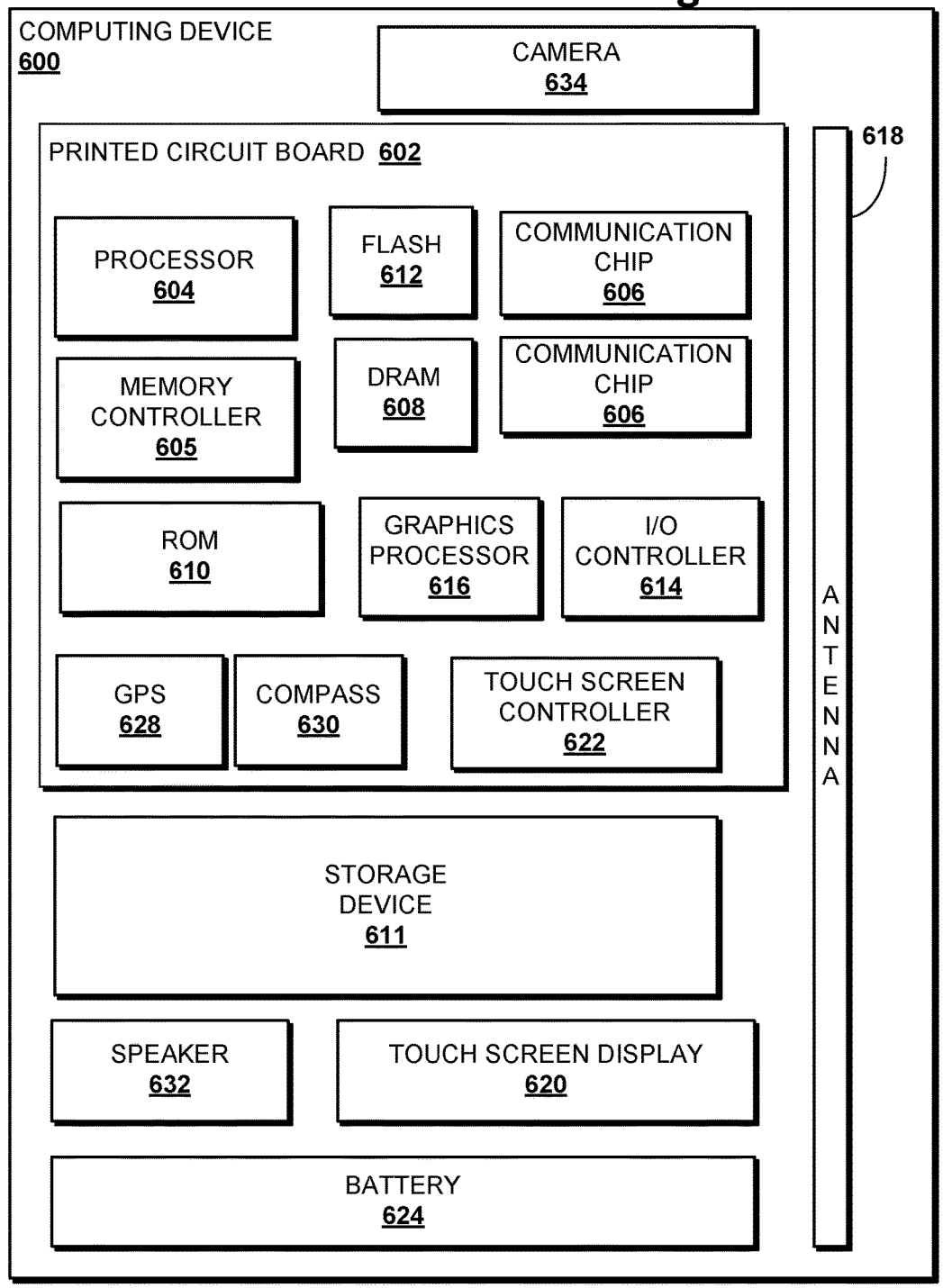
FIG. 6 illustrates an example system configured to employ the apparatuses and methods described herein, in accordance with various embodiments.

FIG. 6 illustrates an example computing device 600 that may employ the apparatuses and/or methods described herein (e.g., integrated circuit 100, flip-flop circuit 200, and/or flip-flop circuit 400), in accordance with various embodiments. As shown, computing device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, memory controller 605, volatile memory (e.g., dynamic random access memory (DRAM) 608), non-volatile memory such as read only memory (ROM) 610, flash memory 612, storage device 611 (e.g., a hard-disk drive (HDD)), an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD)) (not shown), and so forth. In various embodiments, the processor 604 may be integrated on the same die with other components to form a System on Chip (SoC).

In some embodiments, the one or more processor(s) 604, flash memory 612, and/or storage device 611 may include associated firmware (not shown) storing programming instructions configured to enable computing device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 612, or storage device 611.

In various embodiments, one or more components of the computing device 600 may include the integrated circuit 100, flip-flop circuit 200, and/or flip-flop circuit 400 described herein. For example, the integrated circuit 100, flip-flop circuit 200, and/or flip-flop circuit 400 may be included in processor 604, communication chip 606, I/O controller 614, memory controller 605, and/or another component of computing device 600. The integrated circuit 100, flip-flop circuit 200, and/or flip-flop circuit 400 may be used to place one or more circuit blocks of the integrated circuit in a sleep state and store data for the circuit block while the circuit block is in the sleep state, as described herein.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 600 may be any other electronic device that processes data.

Some non-limiting Examples of various embodiments are provided below.

Example 1 is a flip-flop circuit comprising: a first inverter and a second inverter cross-coupled between a first node and a second node, the first and second nodes coupled on a signal path of the flip-flop circuit to pass a data signal between an input terminal and an output terminal; a capacitor to store a value of the data signal when the flip-flop is in a sleep state; and an indium-gallium zinc oxide (IGZO) transistor coupled between the capacitor and the first node, the IGZO transistor to turn on when the flip-flop enters the sleep state to store the value of the data signal in the capacitor and then turn off to retain the stored value in the capacitor.

Example 2 is the flip-flop circuit of Example 1, wherein the capacitor is coupled between a drain terminal of the IGZO transistor and a ground potential, and wherein the flip-flop circuit further comprises: a first transistor having a gate terminal coupled to the drain terminal of the IGZO transistor and a drain terminal coupled to the ground potential; and a second transistor coupled between the first transistor and the second node, the second transistor responsive to a restore signal to turn on to transition the flip-flop circuit from the sleep state to an active state.

Example 3 is the flip-flop circuit of Example 2, wherein the first and second transistors are n-type metal-oxide-semiconductor (NMOS) transistors.

Example 4 is the flip-flop circuit of Example 1, wherein the capacitor is a first capacitor and the IGZO transistor is a first IGZO transistor, and wherein the flip-flop circuit further includes: a second capacitor to store an inverted value of the data signal when the flip-flop is in the sleep state; and a second IGZO transistor coupled between the second capacitor and the second node, the second IGZO transistor to turn on when the flip-flop enters the sleep state to store the inverted value of the data signal in the second capacitor and then to turn off to retain the stored inverted value in the second capacitor.

Example 5 is the flip-flop circuit of Example 4, wherein the first capacitor is coupled between a drain terminal of the first IGZO transistor and a ground potential, wherein the second capacitor is coupled between a drain terminal of the second IGZO transistor and the ground potential, and wherein the flip-flop circuit further comprises: a first CMOS transistor having a gate terminal coupled to the drain terminal of the first IGZO transistor and a drain terminal coupled to the ground potential; a second CMOS transistor coupled between the first CMOS transistor and the second node, the second CMOS transistor responsive to a restore signal to turn on to transfer the flip-flop circuit from the sleep state to an active state; a third CMOS transistor having a gate terminal coupled to the drain terminal of the second IGZO transistor and a drain terminal coupled to the ground potential; and a fourth CMOS transistor coupled between the third CMOS transistor and the first node, the fourth CMOS transistor responsive to the restore signal to turn on to transfer the flip-flop circuit from the sleep state to the active state.

Example 6 is the flip-flop circuit of Example 1, wherein the IGZO transistor is further to turn on when the flip-flop exits the sleep state to transfer the stored value to the first node.

Example 7 is the flip-flop circuit of Example 1, wherein the IGZO transistor is a first IGZO transistor coupled to a first terminal of the capacitor, and wherein the flip-flop circuit further includes a second IGZO transistor coupled between a second terminal of the capacitor and the second node, wherein the second IGZO transistor is to: turn on when the flip-flop enters the sleep state to store the value of the data signal in the capacitor and then turn off to retain the stored value in the capacitor; and turn on when the flip-flop exits the sleep state to transfer the stored value to the first node.

Example 8 is the flip-flop circuit of Example 7, further comprising: a third IGZO transistor coupled between the first IGZO transistor and a ground potential, a gate of the third IGZO transistor coupled to the second terminal of the capacitor; and a fourth IGZO transistor coupled between the second IGZO transistor and the ground potential, a gate of the fourth IGZO transistor coupled to the first terminal of the capacitor.

Example 9 is an integrated circuit comprising: a logic circuit to transition between an active state and a sleep state; and a flip-flop circuit coupled to the logic circuit to store data for the logic circuit while the logic circuit is in the sleep state and restore the data when the logic circuit transitions from the sleep state to the active state, wherein the flip-flop circuit includes: a first inverter and a second inverter cross-coupled between a first node and a second node, the first and second nodes coupled on a signal path of the flip-flop circuit to pass a data signal between an input terminal and an output terminal; a capacitor to store a value of the data signal when the circuit block is in the sleep state; a first transistor coupled between a first terminal of the capacitor and the first node; and a second transistor coupled between a second terminal of the capacitor and the second node, wherein the first and second transistors are to receive a retain signal.

Example 10 is the integrated circuit of Example 9, wherein the first and second transistors are to turn on responsive to the retain signal when the logic circuit transitions from the active state to the sleep state and when the logic circuit transitions from the sleep state to the active state.

Example 11 is the integrated circuit of Example 9, wherein the first and second transistors are IGZO transistors.

Example 12 is the integrated circuit of Example 9, wherein the flip-flop circuit further includes: a third transistor coupled between the first terminal of the capacitor and a ground potential and having a gate terminal coupled to the second terminal of the capacitor; and a fourth transistor coupled between the second terminal of the capacitor and the ground potential and having a gate terminal coupled to the first terminal of the capacitor.

Example 13 is the integrated circuit of Example 12, wherein the first, second, third, and fourth transistors are IGZO transistors.

Example 14 is the integrated circuit of Example 9, further comprising a power management circuit coupled to the logic circuit to control transition of the logic circuit between the active state and the sleep state.

Example 15 is the integrated circuit of Example 14, wherein the power management circuit is to turn off a power supply provided to the logic circuit and the flip-flop circuit for the sleep state.

Example 16 is an integrated circuit comprising: a logic circuit to transition between an active state and a sleep state; and a flip-flop circuit coupled to the logic circuit to store data for the logic circuit while the logic circuit is in the sleep state and restore the data when the logic circuit transitions from the sleep state to the active state. The flip-flop circuit includes: a first inverter and a second inverter cross-coupled between a first node and a second node, the first and second nodes coupled on a signal path of the flip-flop circuit to pass a data signal between an input terminal and an output terminal; a capacitor to store a value of the data signal when the logic circuit is in the sleep state; an IGZO transistor coupled between the capacitor and the first node, the IGZO transistor to turn on responsive to a retain signal when the circuit block transitions from the active state to the sleep state; a first transistor having a gate terminal coupled to a node between the IGZO transistor and the capacitor; and a second transistor coupled between the first transistor and the second node, the second transistor to turn on responsive to a restore signal when the logic circuit transitions from the sleep state to the active state.

Example 17 is the integrated circuit of Example 16, wherein the capacitor is a first capacitor and the IGZO transistor is a first IGZO transistor, and wherein the flip-flop circuit further includes: a second capacitor to store an inverted value of the data signal when the logic circuit is in the sleep state; a second IGZO transistor coupled between the second capacitor and the second node, the second IGZO transistor to turn on responsive to the retain signal; a third transistor having a gate terminal coupled to a node between the second IGZO transistor and the second capacitor; and a fourth transistor coupled between the third transistor and the first node, the fourth transistor to turn on responsive to the restore signal when the logic circuit transitions from the sleep state to the active state.

Example 18 is the integrated circuit of Example 17, wherein the first, second, third, and fourth transistors are n-type metal-oxide-semiconductor transistors.

Example 19 is the integrated circuit of Example 16, further comprising a power management circuit coupled to the logic circuit to control transition of the logic circuit between the active state and the sleep state.

Example 20 is the integrated circuit of Example 19, wherein the power management circuit is to turn off a power supply provided to the logic circuit and the flip-flop circuit for the sleep state.

Example 21 is a computer system comprising: a battery; one or more antennas; and a processor coupled to the battery and the one or more antennas. The processor includes: a logic circuit; a power management circuit to switch the logic circuit between an active state and a sleep state; a flip-flop circuit coupled to the logic circuit to store data for the logic circuit while the logic circuit is in the sleep state and restore the data when the logic circuit transitions from the sleep state to the active state, wherein the flip-flop circuit includes: one or more complementary metal-oxide-semiconductor (CMOS) transistors on a signal path of the flip-flop circuit; a capacitor to store a value of a data signal when the logic circuit is in the sleep state; and a thin-film transistor (TFT) coupled between the capacitor and the signal path, the TFT to turn on responsive to a retain signal to store the value in the capacitor when the logic circuit transitions to the sleep state and then turn off to retain the value in the capacitor while the logic circuit is in the sleep state.

Example 22 is the computer system of Example 21, wherein a source terminal of the TFT is coupled to a first node of the signal path, wherein the capacitor is coupled between a drain terminal of the TFT and a ground potential, wherein the one or more transistors form a first inverter and a second inverter that are cross-coupled between the first node and a second node of the signal path, and wherein the flip-flop circuit further includes: a first NMOS transistor having a gate terminal coupled to the drain terminal of the IGZO transistor and a drain terminal coupled to the ground potential; and a second NMOS transistor coupled between the first transistor and the second node, the second NMOS transistor responsive to a restore signal to turn on when the logic circuit transitions from the sleep state to an active state.

Example 23 is the computer system of Example 22, wherein the capacitor is a first capacitor and the TFT is a first TFT, and wherein the flip-flop circuit further includes: a second capacitor to store an inverted value of the data signal when the logic circuit is in the sleep state; a second TFT coupled between the second capacitor and the second node, the second TFT to turn on when the flip-flop enters the sleep state to store the inverted value of the data signal in the second capacitor and then to turn off to retain the stored inverted value in the second capacitor; a third NMOS transistor having a gate terminal coupled to the drain terminal of the second TFT and a drain terminal coupled to the ground potential; and a fourth NMOS transistor coupled between the third NMOS transistor and the first node, the fourth NMOS transistor responsive to the restore signal to turn on when the logic circuit transitions from the sleep state to the active state.

Example 24 is the computer system of Example 21, wherein the TFT is a first TFT coupled between a first terminal of the capacitor and a first node of the signal path, wherein the one or more transistors form a first inverter and a second inverter that are cross-coupled between the first node and a second node of the signal path, and wherein the flip-flop circuit further includes a second TFT coupled between a second terminal of the capacitor and the second node, wherein the second TFT is to: turn on when the flip-flop enters the sleep state to store the value of the data signal in the capacitor and then turn off to retain the stored value in the capacitor; and turn on when the flip-flop exits the sleep state to transfer the stored value to the first node.

Example 25 is the computer system of Example 24, wherein the flip-flop circuit further includes: a third TFT coupled between the first TFT and a ground potential, a gate of the third TFT coupled to the second terminal of the capacitor; and a fourth TFT coupled between the second TFT and the ground potential, a gate of the fourth TFT coupled to the first terminal of the capacitor.

Example 26 is the computer system of Example 21, wherein the TFT is an indium-gallium zinc oxide (IGZO) transistor.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A flip-flop circuit comprising:
   a first inverter and a second inverter cross-coupled between a first node and a second node, the first and second nodes coupled on a signal path of the flip-flop circuit to pass a data signal between an input terminal and an output terminal;
   a capacitor to store a value of the data signal when the flip-flop circuit is in a sleep state; and
   a first indium-gallium zinc oxide (IGZO) transistor coupled between a first terminal of the capacitor and the first node, the first IGZO transistor to turn on when the flip-flop circuit enters the sleep state to store the value of the data signal in the capacitor and then turn off to retain the stored value in the capacitors;
   a second IGZO transistor coupled between a second terminal of the capacitor and the second node, wherein the second IGZO transistor is to turn on when the flip-flop circuit enters the sleep state to store the value of the data signal in the capacitor and then turn off to retain the stored value in the capacitor, and wherein the second IGZO transistor is to turn on when the flip-flop circuit exits the sleep state to transfer the stored value to the first node;
   a third IGZO transistor coupled between the first IGZO transistor and a ground potential, a gate of the third IGZO transistor coupled to the second terminal of the capacitor; and
   a fourth IGZO transistor coupled between the second IGZO transistor and the ground potential, a gate of the fourth IGZO transistor coupled to the first terminal of the capacitor.

2. The flip-flop circuit of claim 1, wherein the first IGZO transistor is further to turn on when the flip-flop circuit exits the sleep state to transfer the stored value to the first node.

3. The flip-flop circuit of claim 1, wherein a power supply received by the flip-flop circuit is turned off when the flip-flop circuit is in the sleep state.

4. The flip-flop circuit of claim 1, wherein the flip-flop circuit is coupled to a logic circuit to retain data for the logic circuit while the logic circuit is powered down.

5. The flip-flop circuit of claim 4, wherein the flip-flop circuit and the logic circuit are to operate from a same power supply.

6. A flip-flop circuit comprising:
   a first inverter and a second inverter cross-coupled between a first node and a second node, the first and second nodes coupled on a signal path of the flip-flop circuit to pass a data signal between an input terminal and an output terminal;
   a first capacitor to store a value of the data signal when the flip-flop circuit is in a sleep state;
   a first indium-gallium zinc oxide (IGZO) transistor coupled between the capacitor and the first node, the first IGZO transistor to turn on when the flip-flop circuit enters the sleep state to store the value of the data signal in the capacitor and then turn off to retain the stored value in the capacitor, wherein the first capacitor is coupled between a drain terminal of the first IGZO transistor and a ground potential;
   a second capacitor to store an inverted value of the data signal when the flip-flop is in the sleep state; and
   a second IGZO transistor coupled between the second capacitor and the second node, the second IGZO transistor to turn on when the flip-flop circuit enters the sleep state to store the inverted value of the data signal in the second capacitor and then to turn off to retain the stored inverted value in the second capacitor, wherein the second capacitor is coupled between a drain terminal of the second IGZO transistor and the ground potential;
   a first CMOS transistor having a gate terminal coupled to the drain terminal of the first IGZO transistor and a drain terminal coupled to the ground potential;
   a second CMOS transistor coupled between the first CMOS transistor and the second node, the second CMOS transistor responsive to a restore signal to turn on to transfer the flip-flop circuit from the sleep state to an active state;
   a third CMOS transistor having a gate terminal coupled to the drain terminal of the second IGZO transistor and a drain terminal coupled to the ground potential; and
   a fourth CMOS transistor coupled between the third CMOS transistor and the first node, the fourth CMOS transistor responsive to the restore signal to turn on to transfer the flip-flop circuit from the sleep state to the active state.

7. The flip-flop circuit of claim 6, wherein the first IGZO transistor is further to turn on when the flip-flop circuit exits the sleep state to transfer the stored value to the first node.

8. The flip-flop circuit of claim 6, wherein a power supply received by the flip-flop circuit is turned off when the flip-flop circuit is in the sleep state.

9. The flip-flop circuit of claim 6, wherein the flip-flop circuit is coupled to a logic circuit to retain data for the logic circuit when the logic circuit is powered down.

10. The flip-flop circuit of claim 9, wherein the flip-flop circuit and the logic circuit are to operate from a same power supply.

* * * * *